(12) United States Patent
Sills et al.

(10) Patent No.: US 8,394,579 B2
(45) Date of Patent: *Mar. 12, 2013

(54) METHODS OF FORMING PATTERNS

(75) Inventors: Scott Sills, Boise, ID (US); Dan Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/309,442

(22) Filed: Dec. 1, 2011

(65) Prior Publication Data

US 2012/0077127 A1    Mar. 29, 2012

Related U.S. Application Data

(63) Continuation of application No. 12/248,219, filed on Oct. 9, 2008, now Pat. No. 8,088,551.

(51) Int. Cl.
G03F 7/00 (2006.01)
G03F 7/004 (2006.01)
G03F 7/40 (2006.01)

(52) U.S. Cl. ............... 430/322; 430/331; 430/273.1; 430/330; 430/311; 430/270.1

(58) Field of Classification Search ............... 420/270.1, 420/311, 273.1, 322, 330, 331
See application file for complete search history.

(56) References Cited

U.S. PATENT DOCUMENTS

| | | | |
|---|---|---|---|
| 5,707,784 A | 1/1998 | Oikawa et al. | |
| 5,759,739 A | 6/1998 | Takemura et al. | |
| 6,746,825 B2 | 6/2004 | Nealey et al. | |
| 7,405,034 B2 | 7/2008 | Yan et al. | |
| 7,560,141 B1 | 7/2009 | Kim et al. | |
| 7,651,735 B2 | 1/2010 | Cheng et al. | |
| 7,790,350 B2 | 9/2010 | Breyta et al. | |
| 8,088,551 B2 * | 1/2012 | Sills et al. | 430/270.1 |
| 2005/0233597 A1 | 10/2005 | Colburn et al. | |
| 2006/0046205 A1 | 3/2006 | Hah et al. | |
| 2007/0212522 A1 | 9/2007 | Heidari et al. | |
| 2008/0041818 A1 | 2/2008 | Kihara et al. | |
| 2008/0193658 A1 | 8/2008 | Millward | |
| 2009/0035668 A1 | 2/2009 | Breyta et al. | |
| 2009/0042146 A1 | 2/2009 | Kim et al. | |
| 2009/0087664 A1 | 4/2009 | Nealey et al. | |
| 2009/0155725 A1 | 6/2009 | Yi et al. | |

OTHER PUBLICATIONS

WO PCT/US2009/056504, Apr. 14, 2010, Written Opinion.
WO PCT/US2009/056504, Apr. 14, 2010, Search Report.
WO PCT/US2009/056504, Apr. 21, 2011, IPRP.
Anderson et al., "Combining Conventional Lithography with Molecular Self-Assembly for Chemical Patterning" Advanced Materials, 2006, 18, pp. 3258-3260.
Baralia et al., "Nanodecoding by Dewetting" Advanced Materials 2007, 19, pp. 4453-4459.
Black et al., "Polymer self assembly in semiconductor microelectronics" IBM J. Res. & Dev., vol. 51 No. 5 Sep. 2007, pp. 605-633.

(Continued)

*Primary Examiner* — Amanda C. Walke
(74) *Attorney, Agent, or Firm* — Wells St. John P.S.

(57) ABSTRACT

Some embodiments include methods of forming patterns in which a block copolymer-containing composition is formed over a substrate, and is then patterned to form a first mask. The block copolymer of the composition is subsequently induced into forming a repeating pattern within the first mask. Portions of the repeating pattern are then removed to form a second mask from the first mask. The patterning of the block copolymer-containing composition may utilize photolithography. Alternatively, the substrate may have regions which wet differently relative to one another with respect to the block copolymer-containing composition, and the patterning of the first mask may utilize such differences in wetting in forming the first mask.

12 Claims, 6 Drawing Sheets

OTHER PUBLICATIONS

Edwards et al., "Mechanism and Kinetics of Ordering in Diblock Copolymer Thin Films on Chemically Nanopatterned Substrates" Journal of Polymer Science Part B, Polymer Physics, vol. 43, pp. 344-3459 2005 Wiley Periodicals, Inc.

Kim, "Synthesis of diblock copolymer containing photoacid-generator by RAFT PMSE 24" Internet Post dated Feb. 5, 2009, one page, http://oasys2.confex.com/acs/237nm/techprogram/P1249484.HTM.

Li et al., "Block copolymer patterns and templates" Materials Today, Sep. 2006, vol. 9, No. 9, pp. 30-39.

Li et al., "Spatially Controlled Fabrication of Nanoporous Block Copolymers" Chem. Mater. Apr. 22, 2004, 16, 3800-3808.

Martinez et al., "Sequential and parallel patterning by local chemical nanolithography" Institute of Physics Publishing, Nanotechnology 18 (2007), 2007 IOP Publishing Ltd., pp. 1-6.

Park et al., "Chemical patterning of sub-50-nm half pitches via nanoimprint lithography" Science Direct, Microelectronic Engineering, 2005 Elsevier B.V., pp. 682-688.

Ressier et al., "Control of micro- and nanopatterns of octadecyltrimethoxysilane monolayers using nanoimprint lithography and atmospheric chemical vapor deposition" J. Vac. Sci Technol. B 25(a), Jan/Feb 2007, 2007 American Vacuum Society, pp. 17-18.

Black, "Nanometer-Scale Pattern Registration and Alignment by Directed Diblock Copolymer Self-Assembly", IEEE Transactions on Nanotechnology, vol. 3(3), Sep. 2004.

Li et al., "Spatially Controlled Fabrication of Nanoporous Block Copolymers", American Chemical Society, Published on web Sep. 4, 2004.

* cited by examiner

_FIG_ 7

_FIG_ 8

_FIG_ 9

__FIG_15

__FIG_16

METHODS OF FORMING PATTERNS

RELATED PATENT DATA

This patent resulted from a continuation of U.S. patent application Ser. No. 12/248,219, which was filed Oct. 9, 2008, which is now U.S. Pat. No. 8,088,551, and which is hereby incorporated herein by reference.

BACKGROUND

Technical Field

A continuing goal of semiconductor processing is to increase integration density. This goal of increasing circuit density permeates through fabrication of all types of circuitry, including memory, logic and sensors. Significant improvement in integrated circuit density may be achieved by reducing the size of individual structures in layouts in which there is a large number of repeating units, such as with integrated memory. The individual structures of integrated memory may be comprised by memory-storage units. Example memory-storage units are NAND unit cells, dynamic random access (DRAM) unit cells, and cross-point memory unit cells.

Photolithography is a conventional method utilized for fabrication of integrated components. Photolithography utilizes light to pattern a photosensitive material. The photolithographically-patterned photosensitive material may then be utilized as a mask for patterning underlying materials to form integrated circuit components.

If only photolithography is utilized to pattern integrated circuit components, integrated circuit density cannot increase beyond a threshold dictated by the minimum attainable feature size obtainable utilizing the photolithography. The minimum feature size may be dictated by, for example, a wavelength utilized during the photolithography.

Several methods have been developed which can be utilized in combination with photolithography to push the minimum attainable feature size to smaller dimensions than may be achieved with photolithography alone. Among such methods is a procedure comprising utilization of a block copolymer to form a pattern within photolithographically-patterned features. The pattern created with the block copolymer may be at higher density than is achievable with photolithographic patterning, and thus may be utilized to create higher integrated circuit densities than are achievable with photolithography alone.

Although the utilization of block copolymers shows promise for increasing integrated circuit density, there are technical obstacles to overcome before block copolymers are adopted for wide-scale use in semiconductor device fabrication.

It would be desirable to develop new methods of forming patterns with block copolymers which enable repeating patterns to be formed to high density. It would be further desirable for such methods to be readily applicable for semiconductor device fabrication.

DETAILED DESCRIPTION OF THE ILLUSTRATED EMBODIMENTS

Some embodiments include methods in which material is provided over a substrate and patterned into a first masking pattern. Subsequently, the material is treated to form repeating segments within the material, and then one or more of the segments is selectively removed to form a second masking pattern superimposed within the first masking pattern. Example embodiments are described with reference to FIGS. 1-16.

Figure 1:
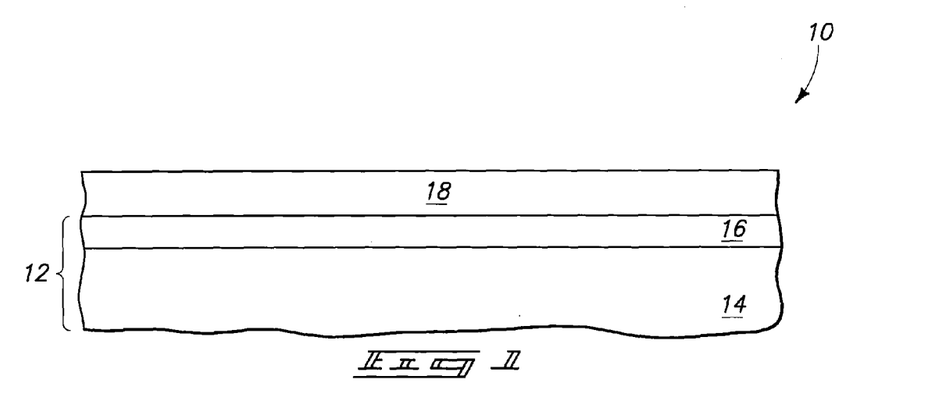
FIGS. 1-5 illustrate a portion of a semiconductor construction at various process stages of an example embodiment.

Referring to FIG. 1, a portion of a semiconductor construction 10 is illustrated. The construction 10 includes a semiconductor substrate 12 and a material 18 formed over the substrate.

Substrate 12 comprises a base 14, and a material 16 supported over the base.

The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Base 14 may correspond to a semiconductor material, and in some embodiments may correspond to a monocrystalline silicon wafer.

Material 16 represents a material which is to be patterned during fabrication of integrated circuitry. Material 16 may be an electrically insulative material (for instance, may comprise one or more of silicon nitride, silicon dioxide, etc.), an electrically conductive material (for instance, may comprise one or more of various metals, metal-containing compositions, conductively-doped semiconductor material, etc.) or a semiconductive material (for instance, silicon, germanium, etc.). Although only the single material 16 is shown supported by base 14, in some embodiments multiple materials may be supported by the base. For instance, if it is desired to form NAND unit cells over base 14, there may be a plurality of gate materials stacked over the base; with such gate materials ultimately being simultaneously patterned to form a plurality of gate constructions supported by the base. As another example, if it is desired to form cross-point memory, there may be a plurality of materials stacked over base 14; with such materials ultimately being simultaneously patterned to form a plurality of lines extending across the base. As yet another example, if it is desired to form DRAM, there may be a plurality of materials stacked over base 14; with such materials ultimately being simultaneously patterned to form a plurality of wordlines and/or bitlines extending across the base.

Material 18 is radiation-sensitive so that it may be patterned by photolithographic methodology, and comprises block copolymer. In some embodiments, material 18 may comprise a blend of block copolymer and conventional photoresist. In other embodiments, material 18 may comprise, consist essentially of or consist of a material which includes both the self-assembling properties of block copolymers and the photosensitivity of photoresist materials. Material 18 may have one or more "leaving groups", which are either radiation-releasable and/or releasable after interaction with additional species that are radiation-releasable, (e.g. photo-acids). Such leaving groups may be referred to as leaving groups that may be released through radiation-induced cleavage.

Copolymers are polymers derived from two or more different monomeric species. Block copolymers contain two or more homopolymer subunits linked by covalent bonds. The union of the homopolymer subunits may utilize an intermediate non-repeating linkage, known as a junction block. The term "block copolymer" may be generic for any heterogeneous material that can micro-phase separate to form domains on sub-lithographic-length scales. Block copolymers may be, for example, organic, organo-metallic, or organo-Si. Block copolymers with two distinct blocks may be referred to as diblock copolymers. Block copolymers may be identified by the number of distinct homopolymer subunits contained therein. For example, block copolymers containing only two distinct homopolymer subunits may be referred to as diblock copolymers, and block copolymers containing only three distinct homopolymer subunits may be referred to as triblock copolymers.

Example block copolymers that may be utilized in applications in which the copolymer is dispersed in conventional photoresist are polystyrene-b-poly (2-vinylpyridine) (PS-b-P2VP); polystyrene-b-poly (ethylene-alt-propylene); polystyrene-b-poly(methylmethacrylate) (PS-b-PMMA); polystyrene-block-poly(ethylene oxide) (PS-b-PEO); and polystyrene-b-poly(dimethyl-siloxane) (PS-b-PDMS). The "b" utilized in each of the above chemical formulas indicates a block linkage.

Example block copolymers that may be utilized in applications in which the copolymer is utilized as a radiation-sensitive compound are copolymers analogous to PS-b-PMMA, and comprising modified subunits that contain leaving groups that may be released through radiation-induced cleavage; with such molecules being base soluble after cleavage of the leaving groups in some embodiments. The modified subunits may be the polystyrene subunit alone, the methylmethacrylate subunit alone, or both the polystyrene subunit and the methylmethacrylate subunit.

If the polystyrene subunit is modified, such modification may utilize poly{4-[(tert-butoxycarbonyl)oxy]styrene} in place of the polystyrene, with the tert-butoxyl group being a leaving group that may be released through radiation-induced cleavage; and if the methylmethacrylate subunit is modified, such modification may utilize cycloolefin-polymethacrylate in place of methylmethacrylate, with the cycloolefin being a group that may be released through radiation-induced cleavage.

Other example block polymers are PS-b-PS$_{modified}$-b-PMMA and PS-b-PMMA-b-PMMA$_{modified}$; where PS$_{modified}$ and PMMA$_{modified}$ are derivatives of polystyrene and poly (methylmethacrylate), respectively.

Material 18 may be deposited over material 16 utilizing any suitable methodology, including, for example, spin-on methodologies. Material 18 may be treated with a so-called "soft bake" after deposition of material 18. In some embodiments, the soft bake may be at a temperature that is near or below the glass transition temperature (Tg) of material 18. In some embodiments, the soft bake may be at a temperature of from about 110° C. to about 120° C., while material 18 has a Tg of from about 140° C. to about 150° C. The soft bake may be utilized to remove solvent that was present in material 18 as a carrier during deposition of material 18.

Figure 2:
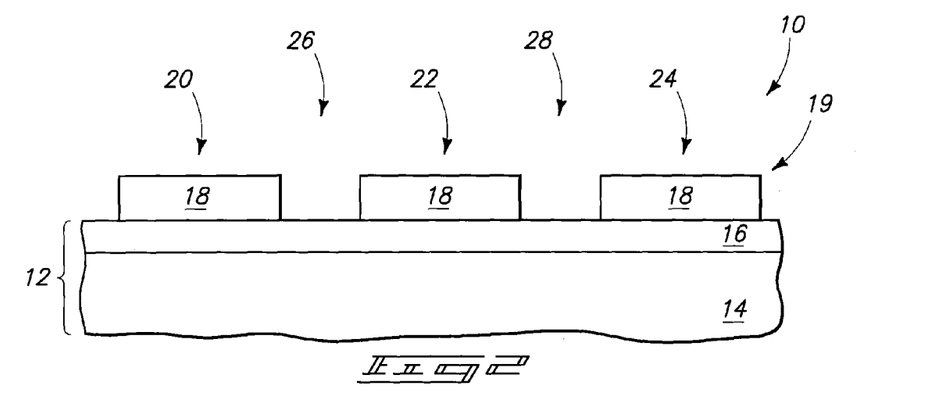

Material 18 may be photolithographically patterned, and FIG. 2 shows construction 10 at a processing stage after photolithographic patterning of material 18. The patterning has formed material 18 into a patterned mask 19. Patterned mask 19 includes a plurality of masking features 20, 22 and 24, which are spaced from one another by intervening gaps 26 and 28. The patterned mask of FIG. 2 (i.e., the mask formed by photolithographic patterning of material 18) may be referred to as a first patterned mask to distinguish it from other masks formed in subsequent processing (discussed below).

The photolithographic patterning of material 18 comprises exposure of some regions of material 18 to electromagnetic radiation (i.e. actinic radiation), while leaving other regions unexposed; followed by utilization of a developer solution to remove either the exposed or unexposed regions, and to leave the non-removed regions as the patterned mask.

The exposure of some regions of material 18 to electromagnetic radiation may be considered to be exposure of material 18 to patterned electromagnetic radiation. The patterned electromagnetic radiation may be of any suitable wavelength, and may, for example, be 365 nanometer wavelength radiation, 248 nanometer wavelength radiation, 193 nanometer wavelength radiation, extreme ultraviolet (EUV) radiation, etc.

In some embodiments, material 18 may receive a thermal treatment after the exposure to the electromagnetic radiation, and prior to the utilization of the developer. Such thermal treatment may be referred to as a "post exposure bake", and may be utilized to enhance migration of chemicals (for instance acid) within chemically-amplified photoresist. The post exposure bake may be conducted at a temperature of less than or equal to a glass temperature of material 18 (with the glass transition temperature being a temperature of at least about 100° C. and less than or equal to about 150° C. in some embodiments); and in some embodiments may be conducted at a temperature of from about 90° C. to about 120° C.

In embodiments in which material 18 comprises block copolymer dispersed in conventional photoresist, the conventional photoresist may be a chemically-amplified resist. If the addition of the block copolymer influences a rate of chemical amplification, the concentration of amplifying chemical and/or the duration of a post-exposure bake may be adjusted to compensate for such influence. For instance, the chemistry or the concentration of a photoacid generator (PAG) may be adjusted.

In embodiments in which material 18 comprises block copolymer modified to have leaving groups that may be released through radiation-induced cleavage, such block copolymer may be utilized in combination with chemical amplifiers (such as, for example, PAGs). In such embodiments, the duration and temperature of the post-exposure bake and/or photoacid generator chemistry, and/or photoacid quench chemistry, may be adjusted to obtain desired amplification of the effect of the electromagnetic radiation exposure.

In embodiments in which the block copolymer comprises poly{4-[(tert-butoxycarbonyl)oxy]styrene} and cycloolefin-polymethacrylate (or similar blocks), the exposure to radiation may convert the subunits of the block copolymer to polyhydroxystyrene (PHOST) and polyacrylic acid (PAA) or similar subunits that may be developed and selectively removed/left from the subunits in unexposed regions. In some embodiments, such conversion may be chemically amplified with a post exposure bake. The specific chemistry described herein is an example chemistry, and other embodiments may utilize other chemistries to achieve similar results.

The exposure to the electromagnetic radiation, and the post-exposure bake (in embodiments utilizing a post-exposure bake), cause some portions of material 18 to be modified relative to other portions. The developer mentioned previously is then utilized to selectively remove either the modified portions, or the unmodified portions. The developer may be a conventional developer suitable for selectively dissolving either the modified or unmodified portions, and may, for example, comprise an aqueous solution of tetramethylammonium hydroxide (TMAH). In embodiments comprising blends of block copolymer and photoresist, the block copolymer in exposed regions may be "developable" by the action of a photoacid generator, and/or the developer may be configured for selectively dissolving the block copolymer in exposed regions without extracting significant amounts of block copolymer from the unexposed regions.

An upper surface of material 16 is uncovered within gaps 26 and 28. In some embodiments, the uncovered upper surface of material 16 may be coated, grafted and/or functionalized to change properties of the upper surface so that it becomes less wettable relative to material 18. Such can impede material 18 from accumulating across gaps 26 and 28 in subsequent processing (discussed below). In some embodiments, the amount of material 18, size of gaps 26 and 28, and parameters of the subsequent processing may be adjusted so that material 18 does not disperse entirely across gaps 26 and 28 regardless of whether or not the upper surface of material 16 is treated. It is noted, however, that there may alternatively be some embodiments in which it is desired for material 18 to extend entirely across gaps 26 and 28 after the subsequent processing.

Figure 3:
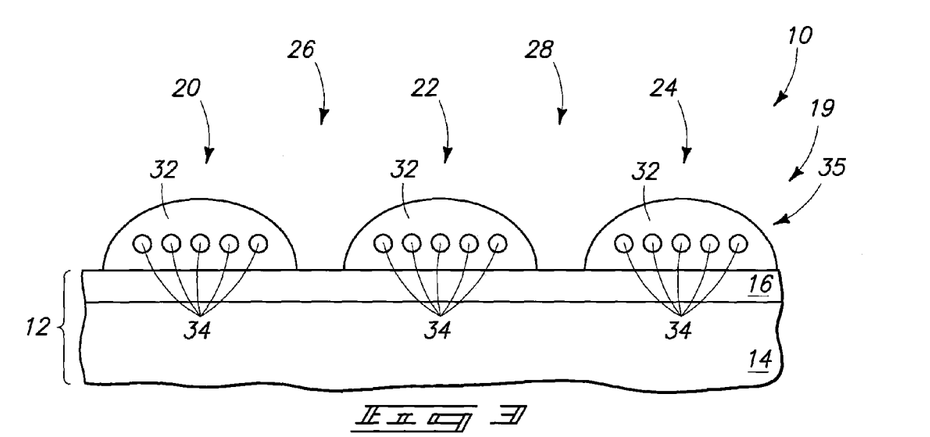
Figure 15:
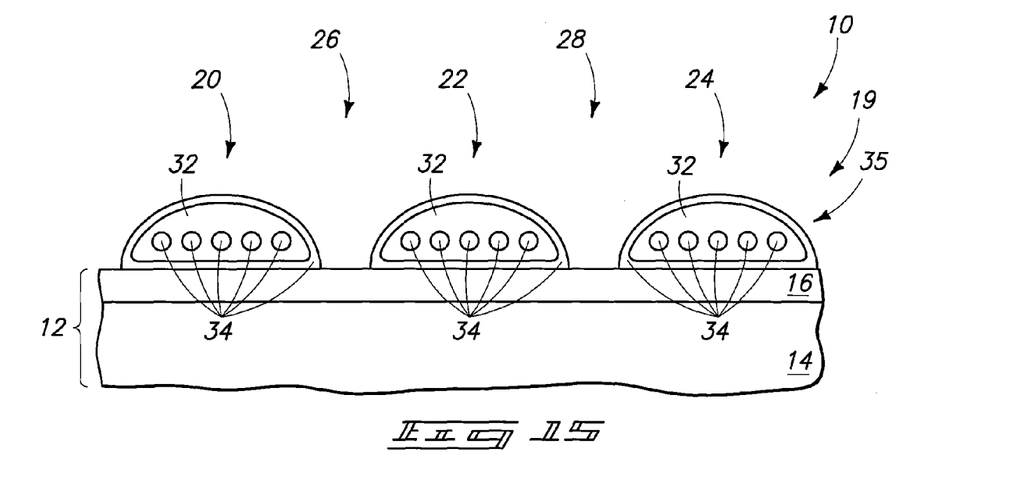
FIG. 15 illustrates a portion of a semiconductor construction at a process stage subsequent to that of FIG. 2 in accordance with another example embodiment.

Referring to FIG. 3, material 18 is subjected to conditions that induce self-assembly of the block copolymer to form features 32 and 34 from the block copolymer. The block copolymer may be a diblock copolymer, and in such embodiments may be generically represented as A-B, where the "A" represents one of the homopolymer subunits, the "B" represents the other of the homopolymer subunits, and the hyphen represents a covalent bond. A pattern resulting from self-assembly of diblock copolymer may be designated by the shorthand A-B:B-A:A-B:B-A; where the hyphen represents covalent interactions, and the colon represents non-covalent interactions. Thus, features 32 may comprise the A subunits of the block copolymer, and features 34 may comprise the B subunits of the block copolymer, or vice versa. The features 32 and 34 differ from one another relative to the wetting of air and substrate interfaces, and this leads to the self-assembly of the features 32 and 34 into the pattern shown in FIG. 3. FIG. 3 illustrates one of many configurations that may result from self-assembly of block copolymer. FIG. 15 shows another configuration that may result from self-assembly of the block copolymer.

In some embodiments, the features 32 may include other components in addition to one of the subunits of the block copolymer. For instance, in embodiments in which material 18 (FIG. 2) comprises the block copolymer in a mixture with other substances, the features 32 may include such other substances as well as including one of the subunits of the block copolymer.

In some embodiments, features 32 may be considered to alternate with features 34 along a cross-section through masking blocks 20, 22 and 24; and in such embodiments the features 32 and 34 along such cross-section may be considered to comprise alternating first and second segments formed from the block copolymer.

The features 34 may be considered to correspond to a second patterned mask 35 that is formed from the first patterned mask 19. Also, a pattern of the features 34 may be referred to as a second pattern. Such second pattern may be considered to be within the first pattern corresponding to the pattern of features 20, 22 and 24, or to be superimposed on the first pattern corresponding to the pattern of features 20, 22 and 24.

FIG. 3 illustrates one of many configurations that may result from self-assembly of block copolymer. FIG. 15 shows another configuration that may result from self-assembly of the block copolymer. In the embodiments of FIGS. 3 and 15, features 34 are cylinders extending into and out of the page relative to the cross-sectional views of the figures. In other embodiments the features may be lamellae, micelles, or surface-perpendicular cylinders.

The conditions utilized to induce self-assembly of the copolymer may be thermal conditions, and may utilize a temperature greater than about the glass transition temperature of material 18 (such temperature may be from greater than 150° C. to less than or equal to about 250° C. in some embodiments). In another embodiment, self-assembly may be induced during a solvent anneal step, where the material is exposed to the partial pressure of an appropriate solvent vapor.

Referring to FIG. 3, the blocks 20, 22 and 24 of the first patterned mask 19 are shown to have undergone reflow during exposure to the conditions utilized to induce self-assembly of the copolymer. Such reflow has changed the shape of blocks 20, 22 and 24 so that the individual blocks have now spread, and become dome-shaped. The spreading of the blocks has reduced the size of gaps 26 and 28 relative to the initial size present at the processing stage of FIG. 2. The amount of spreading of the individual blocks may be influenced by numerous factors, which may include one or more of the following: the composition of the blocks, the initial volume of the blocks, the initial shape of the blocks, the temperature of a treatment utilized to induce self-assembly of the block copolymer, the duration of such treatment, the type of solvent utilized if a solvent anneal is utilized to induce the self-assembly, and a drive to minimize a total area of an air interface. Additionally, the amount of spreading of individual blocks may be influenced by a composition of the surface of material 16, and specifically by the contact angle of material 18 relative to surface 16. In some embodiments, at least some of the surface 16 exposed within gaps 26 and 28 may be treated to render the surface non-wettable by material 18 (FIG. 2) so that the material 18 beads from the surface and does not extend entirely across gaps 26 and 28. Such treatment of surface 16 may include, for example, exposure of the surface to one or more fluoroalkyl silanes and/or silicones; and may be conducted before or after formation of blocks 20, 22 and 24 over surface 16. In another embodiment, the gaps 26 and 28 are closed as material 18 (FIG. 2) reflows during the self-assembly anneal to form the second mask 35, and the features 34 are then formed to be uniformly periodic across the entire surface 16.

The formation of features 34 may be referred to as graphoepitaxial alignment, and may form the features 34 to a pitch that is substantially smaller than a minimum pitch achievable by photolithographic exposure. For instance, features 34 may be formed to a pitch that is less than or equal to one-half of the minimum pitch achievable by the photolithographic process utilized to form the blocks 20, 22 and 24 of FIG. 2.

Figure 4:
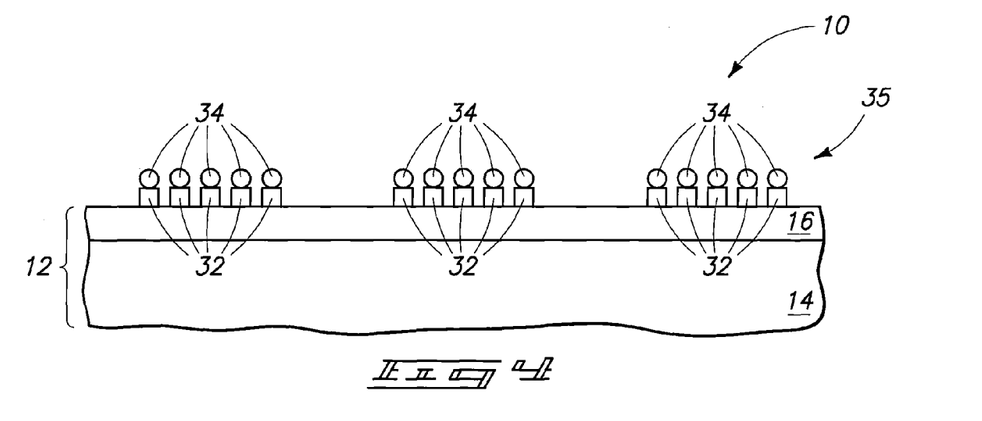

Referring to FIG. 4, most of the features 32 (FIG. 3) are selectively removed relative to features 34, to leave features 34 of patterned mask 35 remaining over material 16. Some of the features 32 remain beneath features 34 in the shown embodiment due to anisotropy of the etch utilized to remove features 32. One method of selectively removing the shown portions of features 32 relative to features 34 is to first selectively modify features 34 relative to features 32 by oxidizing or metalizing the features 34 (i.e., incorporating oxygen or metal into features 34), and to subsequently remove portions of features 32 by ashing with $O_2$ plasma. If the embodiment of FIG. 15 were utilized instead of that of FIG. 3, a punch-through etch may be conducted to remove at least part of the outer skin (which one of the features 34 in the FIG. 15 embodiment) and thereby expose features 32 for subsequent removal.

Figure 5:
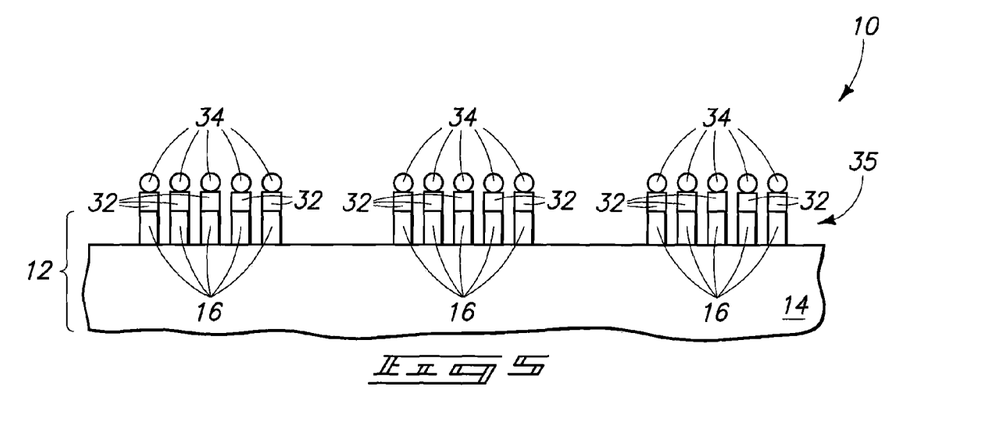

Referring to FIG. 5, the patterned mask 35 may be utilized to fabricate a pattern within material 16. In some embodiments, material 16 may be representative of one or more materials utilized for fabrication of memory architecture (e.g., NAND, DRAM and/or cross-point memory). In such embodiments, the transfer of a pattern into material 16 may represent patterning of one or more materials into structures of memory architecture. In such embodiments, the features 34 may be used to define locations of integrated circuit components within substrate 12. For instance, patterning of material 16 may represent patterning of one or more gate materials of NAND unit cells; may represent patterning of a plurality of lines of cross-point memory cells; and/or may represent patterning of wordlines and/or bitlines of DRAM.

In some embodiments, features 32 and 34 of FIG. 5 may be removed in subsequent processing; and in other embodiments, features 32 and 34 may be left to become incorporated into an integrated circuit construction.

Figure 6:
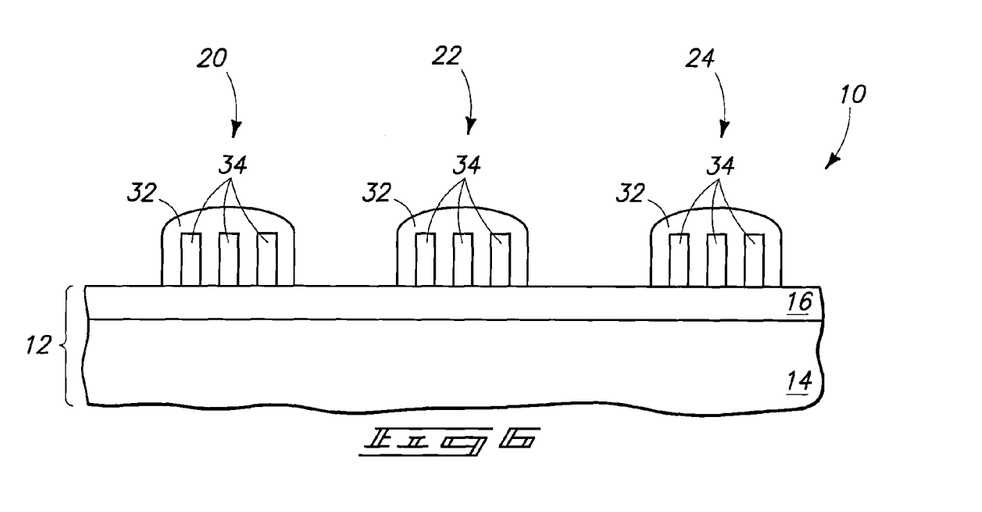
FIGS. 6-8 illustrate the portion of the semiconductor construction of FIG. 2 at various process stages subsequent to FIG. 2 in accordance with another example embodiment.

FIG. 6 shows construction 10 at a processing stage subsequent to that of FIG. 2 in accordance with an embodiment in which the self-assembly of block copolymer has formed lamella rather than cylinders. Accordingly, the material 18 of FIG. 2 has assembled into alternating segments of features 32 and 34. The features 32 and 34 may correspond to the A subunit of a diblock copolymer, and to the B subunit of the diblock copolymer, respectively. The construction of FIG. 6 may be induced by any suitable method, including, for example, changing the volume fractions of the A and B subunits relative to the volume fractions that would form the construction of FIG. 3. The shown lamellae may form if the surfaces of material 16 that are covered by blocks 22, 24 and 26 are neutral relative to wettability by features 32 and 34 (i.e., if features 32 and 34 both wet the surfaces to a comparable amount), and if features 32 are preferentially formed along an air interface relative to features 34.

If composition 18 of FIG. 2 consists of diblock material, then the structure of FIG. 6 may result from induction of self-assembly of the diblock copolymer. In other words, masking blocks 20, 22 and 24 are converted into structures in which only repeating segments formed from the self-assembly are present after the self-assembly. In other embodiments, in which material 18 comprises diblock copolymer in a mixture with other substances, the blocks 20, 22 and 24 at the processing stage of FIG. 6 may comprise other components in addition to the segments formed from self-assembly of the diblock copolymer.

The blocks 20, 22 and 24 at the processing stage of FIG. 6 are illustrated to be less dome-shaped and less spread than analogous blocks at the processing stage of FIG. 3. Such difference between FIGS. 3 and 6 is provided to illustrate that the amount of spreading of blocks 20, 22 and 24 that occurs during inducement of self-assembly of block copolymer may be adjusted by adjusting one or more of the parameters discussed above with reference to FIG. 3.

In subsequent processing, one of the two types of features 32 and 34 of FIG. 6 may be selectively removed relative to the other. If features 34 are to be selectively removed, there can be an etch partially into features 32 to expose features 34 for subsequent removal.

Figure 7:
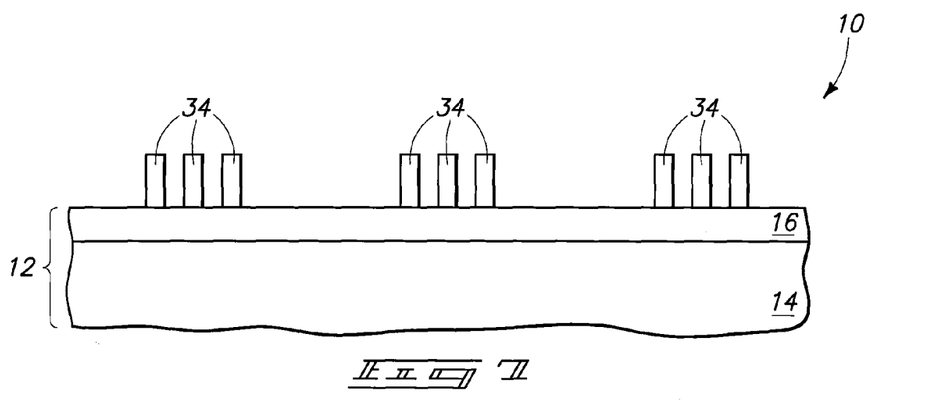

FIG. 7 shows construction 10 after the features 32 have been selectively removed relative to the features 34. The remaining features 34 form a patterned mask of upwardly projecting structures over material 16.

Figure 8:
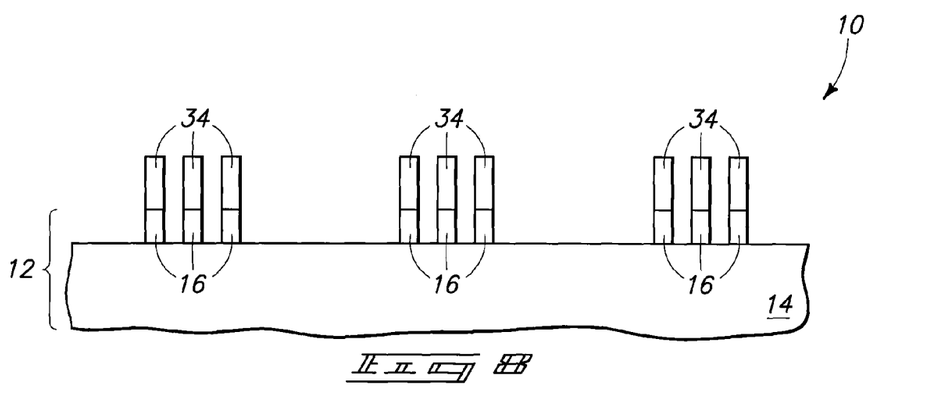

FIG. 8 shows construction 10 after the pattern of the patterned mask of FIG. 7 has been transferred into material 16 with one or more suitable etches.

FIGS. 1-8 illustrate embodiments in which photolithographic processing is utilized to form a first pattern within a photosensitive material comprising block copolymer, and then self-assembly of the block copolymer is utilized to form a second pattern superimposed on the first pattern. Other methods besides photolithography may be utilized to form the first pattern. For instance, FIGS. 9-12 illustrate an example process in which differences of wettability of a substrate surface are utilized to induce the first pattern in a material comprising block copolymer.

Figure 9:
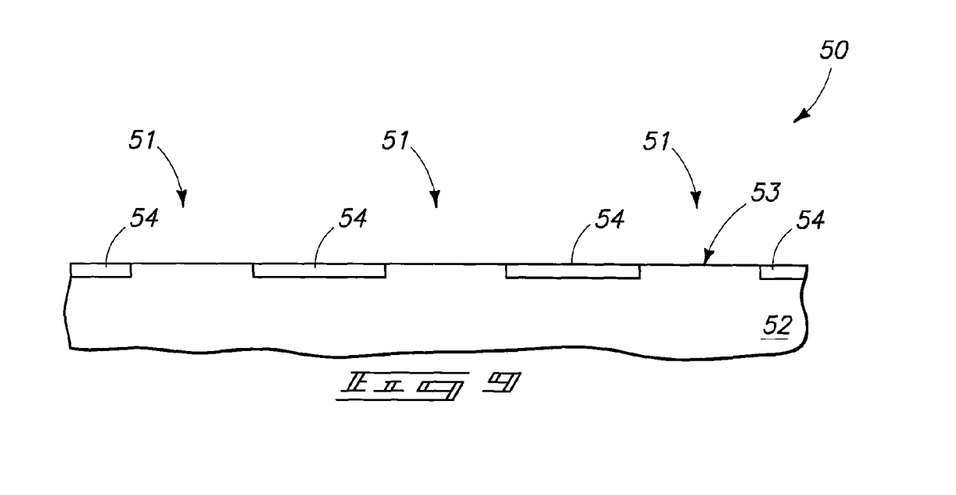
FIGS. 9-14 illustrate a portion of a semiconductor construction at various process stages of another example embodiment.

Referring to FIG. 9, a portion of a semiconductor construction 50 is illustrated. The construction 50 comprises a substrate 52. In some embodiments, substrate 52 may be a semiconductor substrate. In an example embodiment, substrate 52 may be a monocrystalline silicon wafer.

Substrate 52 comprises an upper surface 53. In some embodiments, the upper surface 53 may initially consist of silicon or doped silicon. A plurality of regions 54 are illustrated, with such regions corresponding to segments of upper surface 53 that have been changed in composition relative to the remainder of upper surface 53. Such change in composition will alter wettability of a block copolymer-containing material that is to be subsequently formed over substrate 52. If upper surface 53 consists of silicon or doped silicon, the treatment of the upper surface may comprise subjecting the upper surface to one or more fluoroalkyl silanes and/or silanols. For instance, regions 54 may correspond to portions of the upper surface that have been exposed to perfluoroalkyl silane. Photoresist may be utilized to protect portions of surface 53 which are not to be altered during the treatment that is utilized to form the alterations that lead to regions 54.

In some embodiments, the regions of upper surface 53 that have not been treated may be referred to as first regions 51 of the upper surface, and the treated regions 54 may be referred to as second regions of the upper surface.

Figure 10:
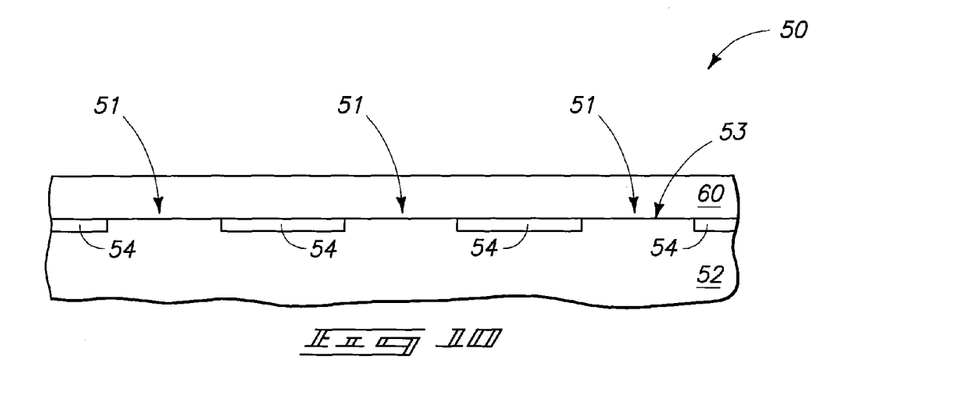
Figure 11:
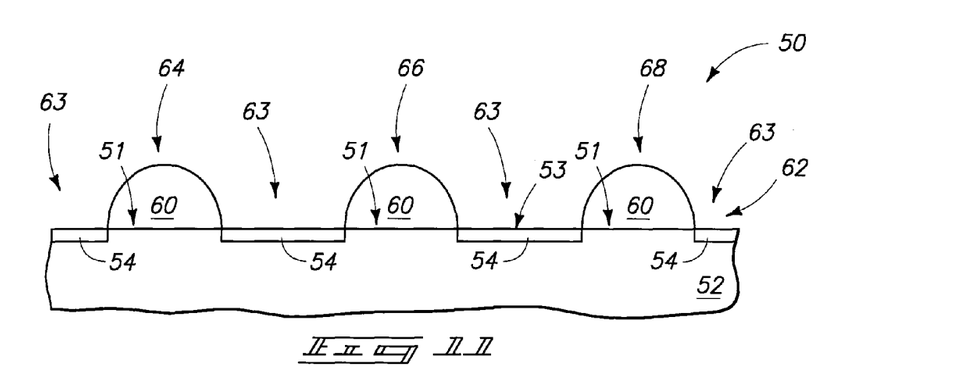

Referring to FIGS. 10 and 11, material 60 is deposited over substrate 52 (FIG. 10); and the material then redistributes to not be over the regions 54 of the surface of substrate 52, and to accumulate (or bead) over the regions 51 of the surface (FIG. 11).

Material 60 comprises block copolymer, and in some embodiments consists of block copolymer dispersed in a carrier solvent. The block copolymer may comprise any suitable block copolymer, and in some embodiments is a diblock copolymer consisting of either polystyrene-block-vinylpyridine or polystyrene-block-ethylene oxide. The block copolymer disperses from regions 54 along the upper surface of material 52, and beads over regions 51 along such upper surface, due to the differences in wettability of material 60 relative to regions 51 and 54. Specifically, regions 51 may be configured to be wettable by material 60, while regions 54 are configured to be non-wettable, and such may cause material 60 to accumulate over regions 51 while dispersing from over regions 54.

The material 60 of FIG. 11 forms a patterned mask 62 having masking features 64, 66 and 68, which are spaced from one another by gaps 63 over the regions 54. The pattern of the masking features 64, 66 and 68 of the patterned mask 62 may be referred to as a first pattern.

Material 60 may be deposited by any suitable method, including, for example, spin-casting.

In some embodiments, the patterned mask 62 may be subjected to a low-temperature bake (i.e., a bake at a temperature of less than about the glass transition temperature of material 60, which may be less than or equal to 150° C. in some embodiments) to remove carrier solvent; and in other embodiments such bake may be omitted. In some embodiments, the low-temperature bake may induce the dewetting from regions 54.

Figure 12:
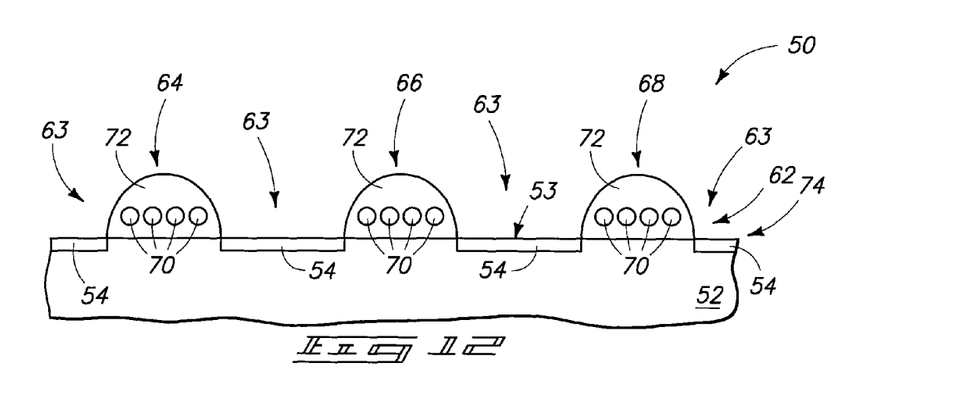

Referring to FIG. 12, patterned mask 62 is subjected to conditions which induce self-assembly of the block copolymer therein. The self-assembly within the block copolymer is shown converting material 60 into features 70 and 72. Features 70 are in the form of cylinders extending into and out of the page relative to the cross-sectional view of FIG. 12. Feature 72 is over and between the features 70. In some embodiments, features 70 may be considered to alternate with features 72 along the a cross-section through masking blocks 64, 66 and 68; and in such embodiments the features 70 and 72 along such cross-section may be considered to comprise alternating first and second segments formed from the block copolymer. In some embodiments, one or both of solvent treatment and thermal treatment (e.g., baking) may induce the self-assembly of FIG. 12 and the dewetting of FIG. 11 simultaneously.

The features 70 may be considered to correspond to a second patterned mask 74 that is formed from the first patterned mask 62. Also, a pattern of the features 70 may be referred to as a second pattern, and such second pattern may be considered to be superimposed on the first pattern corresponding to the pattern of features 64, 66 and 68.

Figure 16:
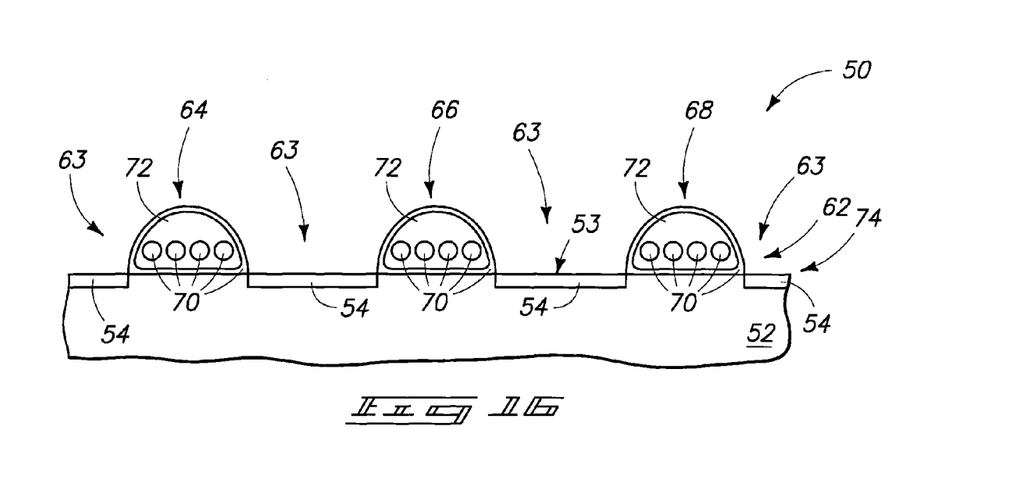
FIG. 16 illustrates a portion of a semiconductor construction at a process stage subsequent to that of FIG. 11 in accordance with another example embodiment.

Although features 70 are cylinders in the shown embodiment, in other embodiments the features may have other shapes. For instance, in some embodiments the features may be lamellar. In embodiments in which the features are lamellar, the construction of FIG. 12 may comprise alternating segments of features 70 and 72 analogous to the alternating segments 32 and 34 shown in FIG. 6. FIG. 12 illustrates one of many configurations that may result from self-assembly of block copolymer. FIG. 16 shows another configuration that may result from self-assembly of the block copolymer.

Figure 13:
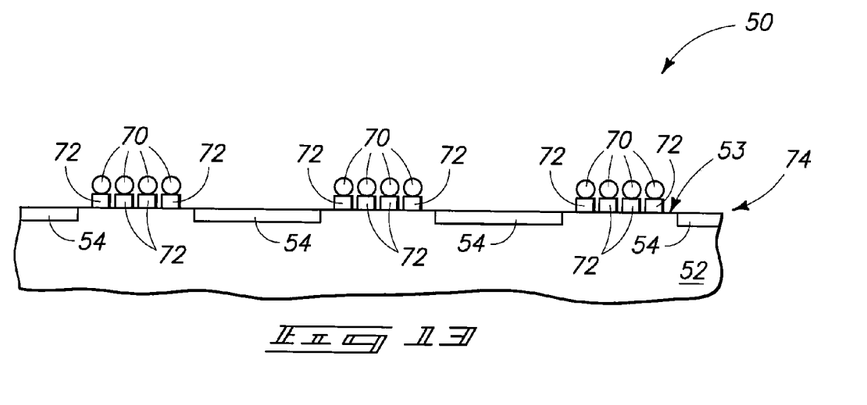

Referring to FIG. 13, most of the features 72 are selectively removed relative to features 70, to leave features 70 of patterned mask 74 remaining over substrate 52. In the shown embodiment, portions of the features 72 remain under the features 70 due to anisotropy of the etch utilized to remove features 72. One method of selectively removing the shown portions of features 72 relative to features 70 is to first selectively modify features 70 relative to features 72 by oxidizing or metalizing the features 70 (i.e., incorporating oxygen or metal into features 70), and to subsequently remove portions of features 72 by ashing with $O_2$ plasma.

Figure 14:
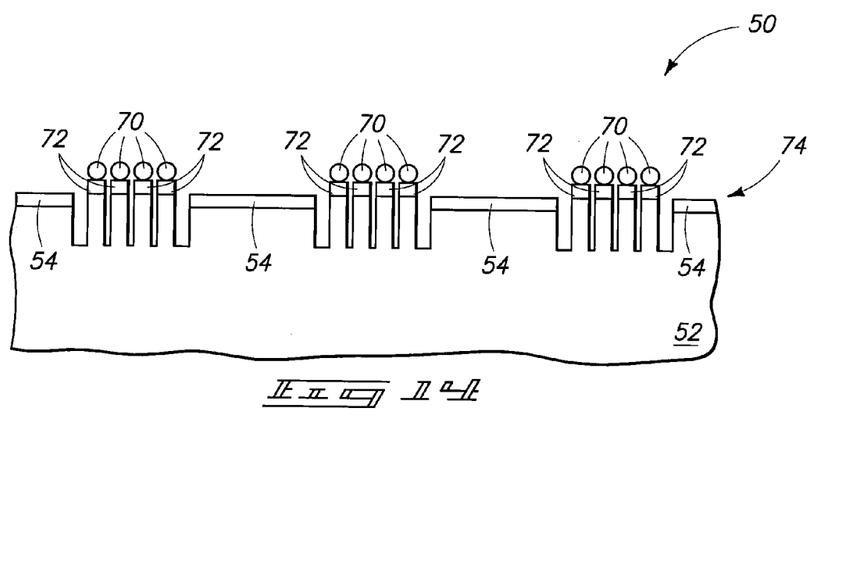

Referring to FIG. 14, the patterned mask 74 has been utilized to fabricate a pattern within substrate 52. In some embodiments, substrate 52 may be utilized for fabrication of memory architecture (e.g., NAND, DRAM and/or cross-point memory). In such embodiments, the transfer of a pattern into substrate 52 may represent patterning of one or more materials into structures of memory architecture. In some embodiments, the features 70 may be used to define locations of integrated circuit components within substrate 52. For instance, patterning of the substrate may represent patterning of one or more gate materials of NAND unit cells; may represent patterning of a plurality of lines of cross-point memory cells; and/or may represent patterning of wordlines and/or bitlines of DRAM.

In some embodiments, features 70 and/or modified regions 54 may be removed in subsequent processing; and in other embodiments, features 70 and/or modified regions 54 may be left to become incorporated into an integrated circuit construction.

The embodiments specifically shown are example embodiments, and the invention includes other embodiments which are not specifically shown. For instance, the example embodiments shown in FIGS. 1-16 induce self-assembly of block copolymer to form masking features that extend horizontally across a substrate surface (specifically, the features 34 of FIG. 4, the features 34 of FIG. 7, and the features 70 of FIG. 13). In other embodiments, not shown, self-assembly of block copolymer may form structures that extend vertically (i.e., project primarily upwardly) relative to a substrate surface. Such vertical structures may be utilized for various applications in semiconductor fabrication, including, for example, fabrication of contact openings to wiring or other electrically conductive structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern, comprising:
   photolithographically patterning a radiation-sensitive block copolymer-comprising composition to form a first mask from the composition; and
   after photolithographically patterning the composition, inducing assembly of the block copolymer to form a second mask from the first mask.

2. The method of claim 1 wherein the block copolymer contains one or more leaving groups that are released through radiation-induced cleavage during the photolithographic patterning.

3. The method of claim 1 wherein the block copolymer is a diblock copolymer.

4. The method of claim 1 wherein the composition comprises the block copolymer dispersed in a photoresist.

5. The method of claim 1 wherein the composition consists of the block copolymer.

6. The method of claim 1 wherein the block copolymer comprises at least one of poly{4-[(tert-butoxycarbonyl)oxy]styrene} and cycloolefin-polymethacrylate.

7. A method of forming a pattern, comprising:
   depositing a masking material over a first material; the first material being supported by a base which comprises monocrystalline silicon; the masking material comprising diblock copolymer dispersed in photoresist and being photolithographically patternable;
   photolithographically patterning the masking material to form a first pattern;
   after forming the first pattern, inducing assembly of the diblock copolymer to form alternating first and second segments within the patterned masking material;

selectively removing one of the first and second segments relative to the other of the first and second segments to form a second pattern superimposed on the first pattern; and utilizing the second pattern to define locations of integrated circuit components within the first material and over the base.

8. The method of 7 wherein the photolithography includes:

exposure to patterned actinic radiation;

thermal treatment of the material at a temperature of less than or equal to about a glass transition temperature of the material after the exposure to the actinic radiation; and exposure to a developer after the thermal treatment.

9. The method of 8 wherein the thermal treatment is a first thermal treatment, and wherein the inducing assembly of the diblock copolymer comprises a second thermal treatment; said second thermal treatment being at a temperature of greater than about the glass transition temperature of the material.

10. A method of forming a pattern, comprising:

utilizing patterned electromagnetic radiation to create a first pattern in a composition which comprises polymer to form a first pattern from the composition; the first pattern having first features; the polymer including at least one of poly{4-[(tert-butoxycarbonyl)oxy]styrene} and cycloolefin-polymethacrylate; and after creating the first pattern, inducing microphase separation within the first features to subdivide individual first features into a plurality of second features and thereby create a second pattern from the first pattern.

11. The method of claim 10 wherein the polymer includes poly{4-[(tert-butoxycarbonyl)oxy]styrene}.

12. The method of claim 10 wherein the polymer includes cycloolefin-polymethacrylate.

* * * * *

UNITED STATES PATENT AND TRADEMARK OFFICE
CERTIFICATE OF CORRECTION

PATENT NO. : 8,394,579 B2
APPLICATION NO. : 13/309442
DATED : March 12, 2013
INVENTOR(S) : Scott Sills et al.

Page 1 of 1

It is certified that error appears in the above-identified patent and that said Letters Patent is hereby corrected as shown below:

In the Claims:

In column 11, line 8, in Claim 8, after "method of" insert -- claim --.

In column 11, line 16, in Claim 9, after "method of" insert -- claim --.

In column 12, line 8, in Claim 10, delete "{4-[(tert -" and insert -- {4-[(tert- --, therefor.

Signed and Sealed this
Twenty-eighth Day of May, 2013

Teresa Stanek Rea
*Acting Director of the United States Patent and Trademark Office*